United States Patent
Lee et al.

(10) Patent No.: US 7,268,589 B2
(45) Date of Patent: Sep. 11, 2007

(54) ADDRESS TRANSITION DETECTOR FOR FAST FLASH MEMORY DEVICE

(75) Inventors: Poongyeub Lee, Cupertino, CA (US); Ming-Chi Liu, Sunnyvale, CA (US)

(73) Assignee: Actel Corporation, Mountain View, CA (US)

( * ) Notice: Subject to any disclaimer, the term of this patent is extended or adjusted under 35 U.S.C. 154(b) by 76 days.

(21) Appl. No.: 11/303,863

(22) Filed: Dec. 16, 2005

(65) Prior Publication Data

US 2007/0139081 A1 Jun. 21, 2007

(51) Int. Cl.
*H03K 19/00* (2006.01)

(52) U.S. Cl. .............................. 326/93; 326/82; 326/86

(58) Field of Classification Search ............ 326/82–83, 326/86, 88, 90, 92, 93–94; 365/189.07, 233–233.5
See application file for complete search history.

(56) References Cited

U.S. PATENT DOCUMENTS

| | | | |
|---|---|---|---|
| 4,633,102 A | 12/1986 | Childers | 307/354 |
| 4,742,247 A | 5/1988 | Venkatesh | 307/231 |
| 4,922,461 A | 5/1990 | Hayakawa et al. | 365/230.08 |
| 4,982,117 A | 1/1991 | Matsuzaki et al. | 307/480 |
| 5,008,858 A | 4/1991 | Ikeda | 365/233.5 |
| 5,057,712 A | 10/1991 | Trinh et al. | 307/465 |
| 5,198,709 A | 3/1993 | OConnell | 307/480 |
| 5,295,117 A | 3/1994 | Okada | 365/233.5 |
| 5,313,435 A | 5/1994 | Kim et al. | 365/233.5 |
| 5,414,659 A | 5/1995 | Ito | 365/200 |
| 5,414,672 A | 5/1995 | Ozeki et al. | 365/233.5 |
| 5,461,334 A | 10/1995 | Honda | 327/227 |
| 5,519,666 A | 5/1996 | McAdams | 365/233.5 |
| 5,553,033 A | 9/1996 | McAdams | 365/233.5 |
| 5,557,226 A | 9/1996 | Honda | 327/227 |
| 5,566,129 A | 10/1996 | Nakashima et al. | 365/233.5 |
| 5,606,269 A | 2/1997 | Pontius et al. | 326/93 |
| 5,672,989 A | 9/1997 | Jang et al. | 327/143 |
| 5,745,431 A | 4/1998 | Pontius et al. | 365/233.5 |
| 5,777,492 A | 7/1998 | Suyama et al. | 327/18 |
| 5,815,464 A * | 9/1998 | Golla et al. | 365/233.5 |
| 5,994,937 A | 11/1999 | Hara et al. | 327/262 |
| 6,016,284 A | 1/2000 | Itagaki et al. | 365/233.5 |
| 6,212,128 B1 | 4/2001 | Pascucci | 365/233.5 |
| 6,285,627 B1 | 9/2001 | Kurihara et al. | 365/233.5 |

* cited by examiner

*Primary Examiner*—Anh Q. Tran
(74) *Attorney, Agent, or Firm*—Sierra Patent Group, Ltd.

(57) ABSTRACT

An address transition detector circuit includes an input node, an output node, a bandgap reference node, and $P_{bias}$ and $N_{bias}$ nodes having voltages derived from the bandgap reference node. First through fifth cascaded inverters are each powered by a p-channel and n-channel MOS bias transistors having their gates coupled respectively to the $P_{bias}$ node and the $N_{bias}$ node. The input of the first inverter is coupled to the input node. First and second capacitors are coupled respectively to ground from the outputs of the first and fourth cascaded inverters. A NAND gate has a first input coupled to the input node, a second input coupled the output of the fifth cascaded inverter, and an output coupled to the output node.

1 Claim, 2 Drawing Sheets

ADDRESS TRANSITION DETECTOR FOR FAST FLASH MEMORY DEVICE

BACKGROUND OF THE INVENTION

1. Field of the Invention

The present invention relates to Flash memory devices. More particularly, the present invention relates to an address-transition detector for a Flash memory device.

2. The Prior Art

The consistency of the pulse width in flash memory devices that perform read operations at the speed of 20 ns, or equivalently in the 50 MHz range is extremely important. Existing designs are not suitable for read speed at this frequency, because the timing variation becomes rather significant in this new environment.

U.S. Pat. No. 4,633,102 discloses a scheme in which the output pulse width varies with the rise time and fall time of the input signal. It is believed that this design is unable generate a constant timing pulse.

U.S. Pat. No. 4,742,247 discloses an address-transition-detector that has good temperature compensation.

U.S. Pat. No. 4,922,461 discloses a pulse generator driving a clock generator.

U.S. Pat. No. 4,982,117 discloses an address-transition-detector that ends its pulse width whenever a transition occurs at the output.

U.S. Pat. No. 5,057,712 discloses an address-transition-detector having a pulse width that suffers from $V_{CC}$, temperature and process variations.

Since flash memory products perform read operations at less than 50 MHz, there is no alternative design or method used in the industry. Thus, a new design that serves this need is desired to meet such a design requirement.

BRIEF DESCRIPTION OF THE INVENTION

The present invention relates to a address transition detector timing pulse generator designed for rapid read operation. This circuit has been designed to provide constant pulse width in various operational conditions. In the read operation, two timing pulses define the duration of pre-equalization and the actual sensing time. At the end of the sensing operation, a one shot signal is issued to latch the output of the sense amplifier.

An address transition detector circuit includes an input node, an output node, a bandgap reference node, and $P_{bias}$ and $N_{bias}$ nodes having voltages derived from the bandgap reference node. First through fifth cascaded inverters are each powered by a p-channel and n-channel MOS bias transistors having their gates coupled respectively to the $P_{bias}$ node and the $N_{bias}$ node. The input of the first inverter is coupled to the input node. First and second capacitors are coupled respectively to ground from the outputs of the first and fourth cascaded inverters. A NAND gate has a first input coupled to the input node, a second input coupled the output of the fifth cascaded inverter, and an output coupled to the output node.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

Although the term "flash" memory often refers to non-volatile memories that are bulk erased on a page-by-page, sector-by-sector, or entire array basis, the term is generally used in the art to refer to any electrically erasable programmable (and re-programmable) non-volatile memory technology, regardless of the particular erase scheme. Current flash memories typically use floating gate transistors, though other types of transistor-based flash memory technologies are known in the art, such as, for example, floating trap devices such as silicon nanocrystal MOS transistors, SONOS, and MONOS transistors.

The present invention relates to a timing pulse generator designed for rapid read operations. This circuit provides a near-constant pulse width in various operational conditions. In the read operation, two timing pulses are needed to define the duration of pre-equalization and the actual sensing time. At the end of the sensing, a one shot signal is issued to latch the output of a sense amplifier.

The consistency of the pulse width is extremely important in environments such as where read operations are designed to be performed at speeds such as 20 ns, or equivalently 50 MHz. Existing design are not believed suitable for read speed at this frequency, because the timing variation becomes rather significant in this new environment. Thus, implementing a new design that serves this need becomes important to meet the requirement of design specifications requiring fast read times.

Figure 1:
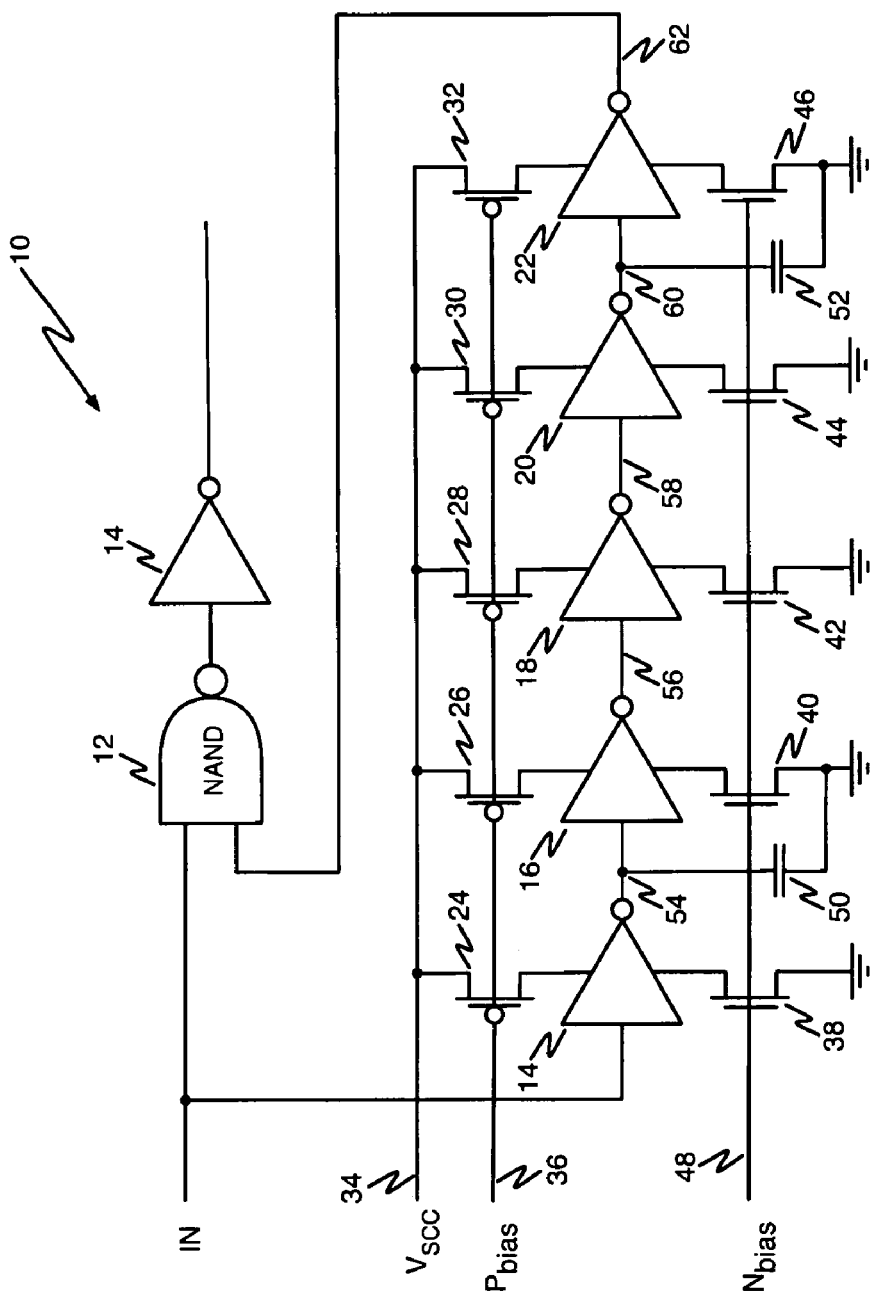
FIG. 1 is a schematic diagram of an address-transition detector according to the present invention.

Referring now to FIG. 1, an address-transition detector circuit 10 according to the present invention includes a NAND gate 12 and a chain of serial inverters 14, 16, 18, 20, and 22. The positive power connections of inverters 14, 16, 18, 20, and 22 are connected serially to P-channel MOS bias transistors 24, 26, 28, 30, and 32, whose sources are driven by a stable supply voltage indicated in FIG. 1 as $V_{SCC}$ shown at reference numeral 34, which is generated from a bandgap reference voltage. Generation of a bandgap reference voltage is known in the art. For example, in a device with a supply voltage ($V_{CC}$) that varies between approximately 0.96 volts and 1.6 volts, a stable supply voltage $V_{SCC}$ of 0.9 volts may be supplied that does not fluctuate, even if the $V_{CC}$ of the device fluctuates.

The gates of P-channel MOS bias transistors 24, 26, 28, 30, and 32 are driven by a $P_{bias}$ signal shown at reference numeral 36. The negative power connections of inverters 14, 16, 18, 20, and 22 are connected serially to N-channel MOS bias transistors 38, 40, 42, 44, and 46, whose sources are coupled to ground. The gates of N-channel MOS bias transistors 38, 40, 42, 44, and 46 are driven by an $N_{bias}$ signal shown at reference numeral 48. Bandgap reference circuits are known in the art. Both the $P_{bias}$ and $N_{bias}$ signals are derived from the bandgap reference. Since the bandgap reference generates both bias signals, the current capabilities of inverters 14, 16, 18, 20, and 22 are more consistent across temperature and process corner variations. This is the first attribute of the circuit of the present invention that contributes to providing constant timing.

In integrated circuits where the power supply voltage $V_{CC}$ ranges from 0.96v to 1.6v, a stabilized, bandgap reference voltage can be provided at 0.9v by using the output voltage of a bandgap reference (e.g., 0.6v) and traditional analog buffer design. The supply of inverters 14, 16, 18, 20, and 22 is coupled to $V_{BGR}$ to remove the timing variation caused by the $V_{CC}$ variation. This is the second attribute to provide constant timing.

Inverters 14, 16, 18, 20, and 22 are identical inverters that merely invert the input signal. To create more delay throughout the inverter chain, capacitors 50 and 52 are coupled to ground from the outputs of inverters 14 and 20 and are typically identical in value. Typical values for these capacitors are in the range of between about 0.05 pF and about 0.2 pF. Inverters 14 and 20 are identical devices as are inverters 16 and 22. Inverters 14 and 20 and capacitors 50 and 52 create the delay and inverters 16 and 22 just buffer the output. Inverters 16 and 22 are relatively stronger than inverters 14 and 20. In the curve of Vout/Vin of any inverter, the trip point of the inverter varies from case to case. In addition, the MOS bias transistors 24, 30, 38, and 44 coupled to inverters 14 and 20 are downsized relative to the MOS bias transistors 26, 28, 32, 40, 42, and 46, driving inverters 16, 18, and 22 to lower their current capability. According to the present invention, the size differences between the downsized transistors and the other bias transistors is about 1:4.

For purposes of explaining the operation of the circuit of FIG. 1, the output of inverter 14 will be identified as node 54, the output of inverter 16 will be identified as node 56, the output of inverter 18 will be identified as node 58, the output of inverter 20 will be identified as node 60, and the output of inverter 22 will be identified as node 62.

The rising delay "$T_r$" of node 54 and falling delay "$T_f$" of node 62 depend on the trip points of the inverters. If the n-channel MOS bias transistors are stronger than the p-channel MOS bias transistors, the capacitors 50 and 52 will both discharge faster than they charge, since the n-channel MOS bias transistors 38 and 44 have more discharge current carrying capacity than the relatively weaker p-channel MOS bias transistors 24 and 30 have charging current capacity. Therefore the rise time $T_r$ of node 54 would be relatively shorter than the fall time $T_f$ of node 62. This occurs because capacitor 48 is discharged through n-channel MOS bias transistor 38 causing the output of inverter 16 to rise quickly and because capacitor 50 is charged by the relatively weaker p-channel MOS bias transistor 30. If, however, the p-channel MOS bias transistors are stronger than the n-channel MOS bias transistors, then the rise time $T_r$ of node 54 would be relatively longer than the fall time $T_f$ of node 62. In either case, the quantity $T_r+T_f$ will remain relatively constant.

The inverter 18 is used to invert the incoming signal, so that the falling delay of node 54 and rising delay of node 62, respectively are timed using capacitors 50 and 52. The reason for doing this is to balance out the delay-time difference caused by the shift of the trip points of the inverters. The trip point of the inverter shifts because of process variations (which cause different driving capability of n-channel MOS transistors and p-channel MOS transistors, respectively). Temperature variations also have a similar effect since the mobility of electrons and holes varies in a different ratio.

The signal "IN" goes high when any address transition occurs. By definition this is regarded as an initialization of reading a new address. Once the signal "IN" goes high, "OUT" will go high through inverter 64 since node 62 at the output of inverter 22 remains high, until the "IN" signal transition propagates through the inverter chain to drive node 62 to low. The time it takes to toggle node 62 to a low state is the width of the actual pulse generated by the ATD circuit.

An advantage of the address-transition detector circuit of the present invention is that it removes the need for an analog comparator which would introduce more timing variation. Also, the present invention shows great consistency under various supply voltages and temperature fluctuations, as well as physical differences in circuit components caused by process issues.

Figure 2:
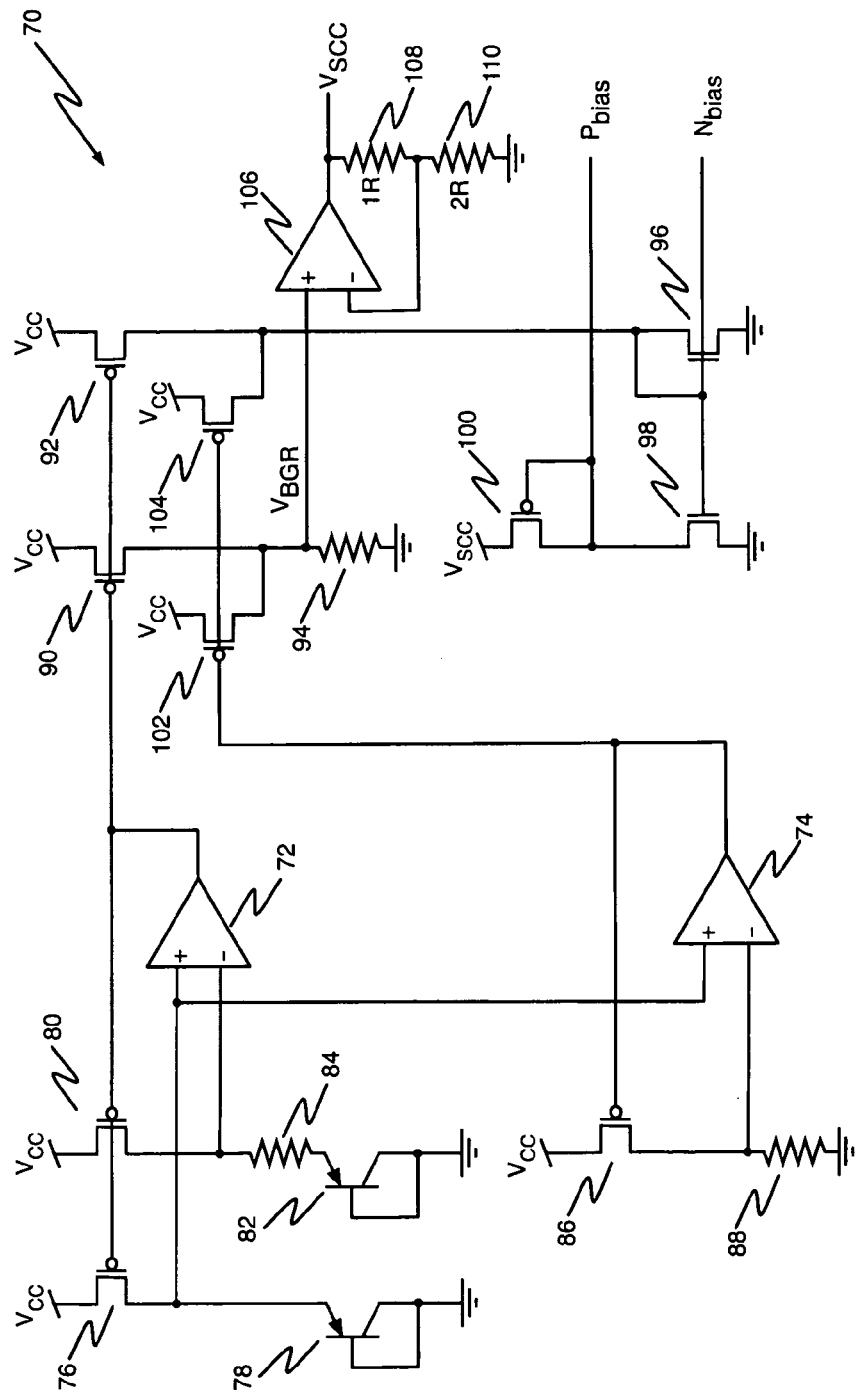
FIG. 2 is a schematic diagram of a circuit that may be used to generating bias voltages from a bandgap reference for use in a circuit such as shown in FIG. 1

Referring now to FIG. 2, a representative circuit 70 is shown that may be used to generate the $V_{BGR}$, $P_{bias}$ and $N_{bias}$ signals from a bandgap reference. Two sense amplifiers 72 and 74 are used in circuit 70. Their main feature is to equalize the voltages at their positive and negative inputs by feedback from their outputs to the circuits that drive these input voltages.

Sense amplifier 72 has its non-inverting input coupled to the common connection of the drain of p-channel MOS transistor 76 and the emitter of PNP transistor 78. The base of PNP transistor 78 is coupled to its collector. The gate of p-channel MOS transistor 76 is coupled to the output of sense amplifier 72. The inverting input of sense amplifier 72 is coupled to the drain of p-channel MOS transistor 80, which is, in turn, coupled to the emitter of PNP transistor 82 through resistor 84. The base of PNP transistor 80 is coupled to its collector. The gate of p-channel MOS transistor 80 is coupled to the output of sense amplifier 72.

Sense amplifier 74 has its non-inverting input coupled to the common connection of the drain of p-channel MOS transistor 76 and the emitter of PNP transistor 78. The inverting input of sense amplifier 72 is coupled to the common connection of the drain of p-channel MOS transistor 86 and resistor 88, which is, in turn, coupled to ground. The output of sense amplifier 74 is coupled to the gate of p-channel MOS transistor 86.

The output of sense amplifier 72 is also coupled to the gates of p-channel MOS transistors 90 and 92. The drain of p-channel MOS transistor 90 is coupled to ground through resistor 94. The common connection of the drain of p-channel MOS transistor 90 and resistor 94 is the output node $V_{BGR}$. The drain of p-channel MOS transistor 92 is coupled to the drain of n-channel MOS transistor 96. N-channel MOS transistor 98 forms a current mirror with n-channel MOS transistor 96. The common connection of the gate and drain of n-channel MOS transistor 96 and the gate of n-channel MOS transistor 98 is the $N_{bias}$ node, which is the output for the voltage $N_{bias}$. The drain of n-channel MOS transistor 98 is coupled to the gate and drain of p-channel MOS transistor 100 and forms the $P_{bias}$ node, which is the output for the voltage $P_{bias}$.

The output of sense amplifier 74 is coupled to the gates of p-channel MOS transistors 102 and 104. The drain of p-channel MOS transistor 102 is coupled to the drain of p-channel MOS transistor 90 and the drain of p-channel MOS transistor 104 is coupled to the drain of p-channel MOS transistor 92. The voltage at resistor 94, $V_{BGR}$, may be used to generate the stable supply voltage $V_{SCC}$ by employing error amplifier 106 with a voltage divider including resistors 108 and 110 deriving the feedback voltage to its inverting input. In the example shown in FIG. 2, resistor 110 is twice the value of resistor 108. If $V_{BGR}$ is 0.6, the output voltage $V_{SCC}$ at the output of amplifier 106 (a stable voltage supply node) will be 0.9V as is understood in the art.

In the circuit of FIG. 2, when the system reaches equilibrium, the voltage at the non-inverting input of sense amplifier 72 and the inverting input of sense amplifier 74 are both equal to VBE1. The outputs of both sense amplifiers 72 and 74 are tied to numerous PMOS transistors as current supplies for each division.

Current mirrors are formed by tying together the gates of the p-channel MOS transistors 76, 80, 90, And 92 connected to $V_{CC}$, and the n-channel MOS transistors 96 and 98 connected to ground. When all transistors are operated in saturation mode, the driving current of these transistors will be approximately the same, regardless of the level of drain voltage.

In the circuit depicted in FIG. 2, the gates of p-channel MOS transistors 76, 80, 90, And 92 are connected together. As well as two other groups of current mirrors formed from p-channel MOS transistors 86, 102, and 104 and n-channel MOS transistors 96 and 98. Also, the sizes of these transistors in each group are the same. The function of the current mirrors is to duplicate the current from one leg to another, and to provide additional current to other legs. Thus, the currents through p-channel MOS transistors 76, 80, 90, and 92 are equal. The currents through n-channel MOS transistors 96 and 98 are equal. The current through n-channel MOS transistor 96 equals the sum of the currents through p-channel MOS transistors 92 and 104. The current through resistor 94 equals the sum of the currents through p-channel MOS transistors 90 and 102. The constant voltage output $V_{BGR}$ is generated by adding two quantities (the outputs of amplifiers 72 and 74) with opposite temperature coefficients with proper weighting. For example, the typical base-emitter voltage in 0.13 micron processes is around 400 mV, with negative temperature dependence. With a PNP transistor $V_{BE}$=300 mV and T=300° K., $\partial V_{BE}/\partial T \approx -1.5$ mV/° K. $V_{BE}$ is the negative temperature coefficient. PNP transistor 82 is formed from three transistors, each the size of PNP transistor 78 in order to provide three times the current through PNP transistor 82 than through PNP transistor 78.

After proper sizing of resistors 84, 88, and 94, a constant voltage $V_{BGR}$ is generated. The sizing of the resistors can be understood by examining the following equation: $V_{BGR}=ATR_{94}/R_{84}+V_{BE}R_{94}/R_{88}$. The first term of the equation is a positive coefficient and the second term of the equation is a negative coefficient. The constant "A" is a constant derived from the familiar $V_t$ expression KT/Q multiplied by 1 n (3) from the fact that transistor 82 is composed of three paralleled bipolar transistors, and "T" is the absolute temperature in degrees Kelvin. As is apparent from the equation, any resistance variation as a function of temperature is canceled out.

Since the current through resistor 94 equals the current through n-channel MOS transistor 96, by providing n-channel MOS transistor 96 with both the gate and drain connected to the drain of p-channel MOS transistor 92, the "$N_{bias}$" signal is generated as the bias voltage for the n-channel MOS transistors. By further tying the gate of n-channel MOS transistor 96 to the gate of n-channel MOS transistor 98, and connecting the drain of n-channel MOS transistor 98 to the drain and gate of p-channel MOS transistor 100, the "$P_{bias}$" signal is generated as the bias voltage for the p-channel MOS transistors.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An address transition detector circuit including:
   an input node;
   an output node;
   a stable voltage supply node;
   a Pbias node having a first voltage derived from a voltage at the bandgap reference node;
   an Nbias node having a second voltage derived from a voltage at the bandgap reference node, the second voltage being lower than the first voltage;
   first through fifth cascaded inverters, the first cascaded inverter coupled to the input node, each cascaded inverter powered by a p-channel MOS bias transistor and an n-channel MOS bias transistor, the gates of each p-channel MOS bias transistor coupled to the Pbias node, the gates of each n-channel MOS bias transistor coupled to the Nbias node, the sources of each p-channel MOS bias transistor coupled to the bandgap reference node, the sources of each n-channel MOS bias transistor coupled to ground;
   a first capacitor coupled between the output of the first cascaded inverter and ground;
   a second capacitor coupled between the output of the fourth cascaded inverter and ground;
   a NAND gate having a first input coupled to the input node, a second input coupled the output of the fifth cascaded inverter, and an output coupled to the output node.

* * * * *